United States Patent
Sichert et al.

[19]

[11] Patent Number: 6,008,695
[45] Date of Patent: Dec. 28, 1999

[54] INPUT AMPLIFIER FOR INPUT SIGNALS WITH STEEP EDGES

[75] Inventors: Christian Sichert; Zoltan Manyoki, both of München, Germany

[73] Assignee: Siemens Aktiengesellschaft, Munich, Germany

[21] Appl. No.: 09/054,926

[22] Filed: Apr. 3, 1998

[30] Foreign Application Priority Data

Apr. 3, 1997 [DE] Germany .................. 197 13 832

[51] Int. Cl.⁶ .................................................. H03F 3/45
[52] U.S. Cl. ................................. 330/253; 330/260
[58] Field of Search .......................... 330/259, 260, 330/252, 253

[56] References Cited

U.S. PATENT DOCUMENTS 5,162,749  11/1992  Kobayashi ..................... 330/253
5,189,318   2/1993  Tanaka ......................... 307/352
5,351,011   9/1994  Seevinck et al. ............... 330/253
5,451,897   9/1995  Komuro ........................ 327/544

FOREIGN PATENT DOCUMENTS

0687070B1  12/1995  European Pat. Off. .
4419892C1   6/1995  Germany .
4301921    10/1992  Japan .
6104725     4/1994  Japan .

Primary Examiner—Robert Pascal
Assistant Examiner—Henry Choe
Attorney, Agent, or Firm—Herbert L. Lerner; Laurence A. Greenberg

[57] ABSTRACT

An input amplifier for input signals with steep edges has a MOS transistor, whose source or drain is connected to a node connected to an output stage. The output signal is fed back into the amplifier which prevents the MOS transistor from being turned off by steep edge input signals. The node is pulled up to the operating voltage as soon as the input signal is present.

4 Claims, 2 Drawing Sheets

6,008,695

1

INPUT AMPLIFIER FOR INPUT SIGNALS WITH STEEP EDGES

BACKGROUND OF THE INVENTION

Field of the Invention

The invention relates to an input amplifier for input signals with steep edges (in particular "high-low" edges) which has at least one transistor with an electrode connected to an output.

CMOS input amplifiers have been known for a relatively long time. They are used for the most manifold purposes in circuitry. For instance, an input amplifier of the above type is described in the textbook "CMOS Analog Circuit Design" by P. E. Allen and D. R. Holberg, p. 381.

A prior art amplifier of that type is illustrated in FIG. 1, which will be described in detail below.

Possible uses of such prior art input amplifiers are for instance LVTTL circuits (LVTTL stands for low voltage transistor-to-transistor logic) and SSTL logic circuits (SSTL stands for stub series terminated logic). In LVTTL logic circuits, leading and trailing voltage edges of approximately 0.8 V to 2.0 V occur, while the SSTL logic circuits have corresponding leading and trailing edges of approximately 400 mV about a reference value.

In both logic circuits, that is, the LVTTL logic circuits and the SSTL logic circuits, the trailing voltage edges are very steep, so that the input edges are correspondingly fast. If numerous input amplifiers are provided on a chip, then in a current-saving operating mode as many of them as possible should be deactivated so that they will not consume current. It is moreover desirable to put the input receivers that have remained active into a current-free state by means of the input signals. In any case, only those circuits that are being driven should actually be active.

However, it has been found that in the case of steep edges of the input signals, the input amplifier enters a current-free final state much too quickly, thereby preventing switching of the output signal.

This problem has been previously attacked by employing asymmetrical input amplifiers. This renders the switching operation fast enough so as to be concluded before the final state is reached. As a consequence of this dimensioning, however, in the least favorable case the DC current consumption is increased ("worst-case DC consumption").

SUMMARY OF THE INVENTION

It is accordingly an object of the invention to provide a input amplifier for steep edge input signals, which overcomes the above-mentioned disadvantages of the prior art devices and methods of this general type and which can switch reliably even in the presence of fast input edges.

With the foregoing and other objects in view there is provided, in accordance with the invention, an input amplifier for input signals with steep edges, comprising:

an input receiving an input signal and an output outputting an output signal;

at least one transistor having an electrode connected to the output; and a device for preventing a premature complete shutoff of the input amplifier, the device preventing a current through the input amplifier from being turned off until after the input signal has been evaluated.

In other words, the invention is characterized by the device which prevents a premature complete shutoff of the

2 input amplifier. The effect is that the current through the input amplifier is not turned off until after the input signal has been evaluated.

Several aspects distinguish the novel input amplifier, such as for instance:

in steady-state operation, when there is a sufficiently low or high input level, no current flows through the amplifier; and after switching from one output state to the other, the current through the amplifier is not turned off—due to the feedback of the output signal—until after the input signal has been evaluated.

In accordance with an added feature of the invention, device includes a delay element and a current source connected between the output and the amplifier. In other words, the delay element is a feedback through which current is supplied to the amplifier.

In accordance with a concomitant feature of the invention, the current source of the device is a transistor.

Other features which are considered as characteristic for the invention are set forth in the appended claims.

Although the invention is illustrated and described herein as embodied in an input amplifier for input signals with steep edges, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
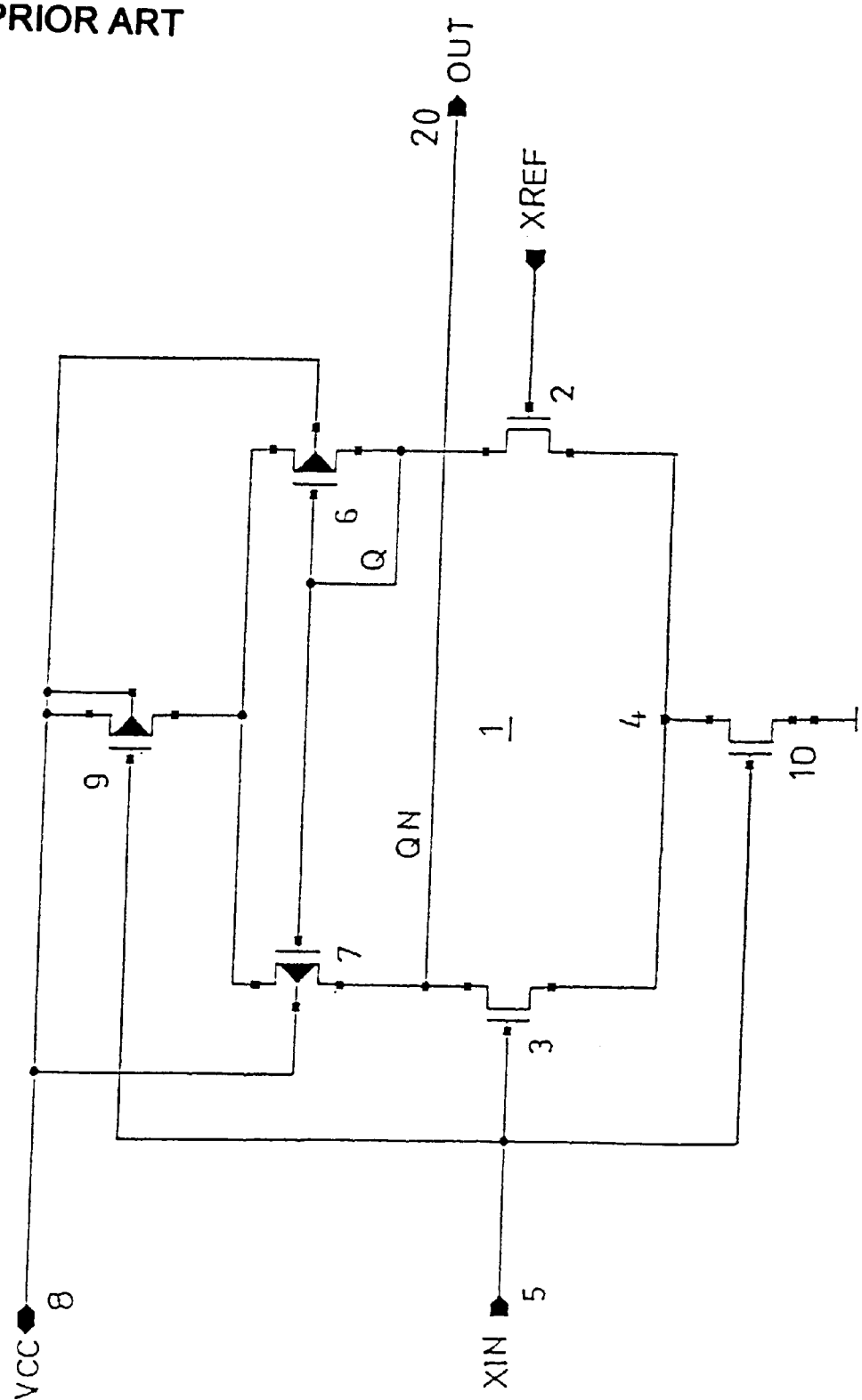
FIG. 1 is a circuit diagram illustrating a prior art input amplifier.

Referring now to the figures of the drawing in detail in which equivalent components are provided with the same reference numerals throughout, and first, particularly, to FIG. 1 thereof, there is seen a prior art input amplifier which comprises a differential amplifier 1 with N-channel MOS transistors 2, 3 and P-channel MOS transistors 6, 7, one P-channel MOS transistor 9 and one N-channel MOS transistor 10. Gates of the transistors 9, 10 and an input IN of the differential amplifier 1 are connected to an input terminal 5, at which an input signal XIN is present. The source-to-drain path of the transistor 9 is connected to a terminal 8 for an operating voltage VCC. The differential amplifier 1 is also acted upon by a reference voltage XREF and is connected to an output terminal 20 for outputting an output signal OUT.

A differential amplifier 1 comprises an N-channel MOS transistor 2, acted upon at its gate with a reference voltage XREF, and an N-channel MOS transistor 3 that is symmetrical to it with regard to a node 4. An input signal XIN is delivered to an input terminal 5, which is connected to the gate of the transistor 3. The drains of the transistors 2, 3 are connected to current mirror P-channel MOS transistors 6, 7. An operating voltage VCC is applied by a terminal 8 to the P-channel MOS transistor 9, the gate of which receives the input signal XIN. The transistor 9 and an N-channel MOS transistor 10, whose source or drain are connected to the node 4 and to whose gate the input signal XIN is applied by the input terminal 5, act as inverters. The gate of the transistor 6 is connected to a node Q between the transistors 2 and 6 and to the gate of transistor 7. A node QN between the transistors 3 and 7 is also connected to the output terminal 20 for furnishing an output signal OUT.

The transistors 9, 10 serve to turn off a quadrature-axis component of current that flows in the differential amplifier 1 when the voltage rises are high.

The transistors 3, 7 are symmetrical to the transistors 2, 6. The current mirror comprising the transistors 6 and 7 may also be embodied with N-channel transistors; analogously, the input transistors 2, 3 may be P-channel MOS transistors.

By way of example, the input signal at the input terminal 5 may be an LVTTL logic signal that drops off steeply from somewhat above 2.0 V to below 0.8 V.

A "high-low voltage edge" of this kind, in a circuit as described above, turns off the transistor 10, and as a result the voltage at the node Q is pulled upward by the transistor 6. This in turn switches off the transistor 7 as well, although intrinsically it should pull the voltage of the node QN upward. In other words, the input amplifier described thus far does not function satisfactorily with input signals that have steep edges.

These problems associated with the prior art circuits are alleviated with the invention which, in order to assure satisfactory operation even with such input signals with steep edges, incorporates a device X in the input amplifier of the invention. The device X prevents a premature complete shutoff of the differential amplifier 1 or of the transistor 7.

Figure 2:
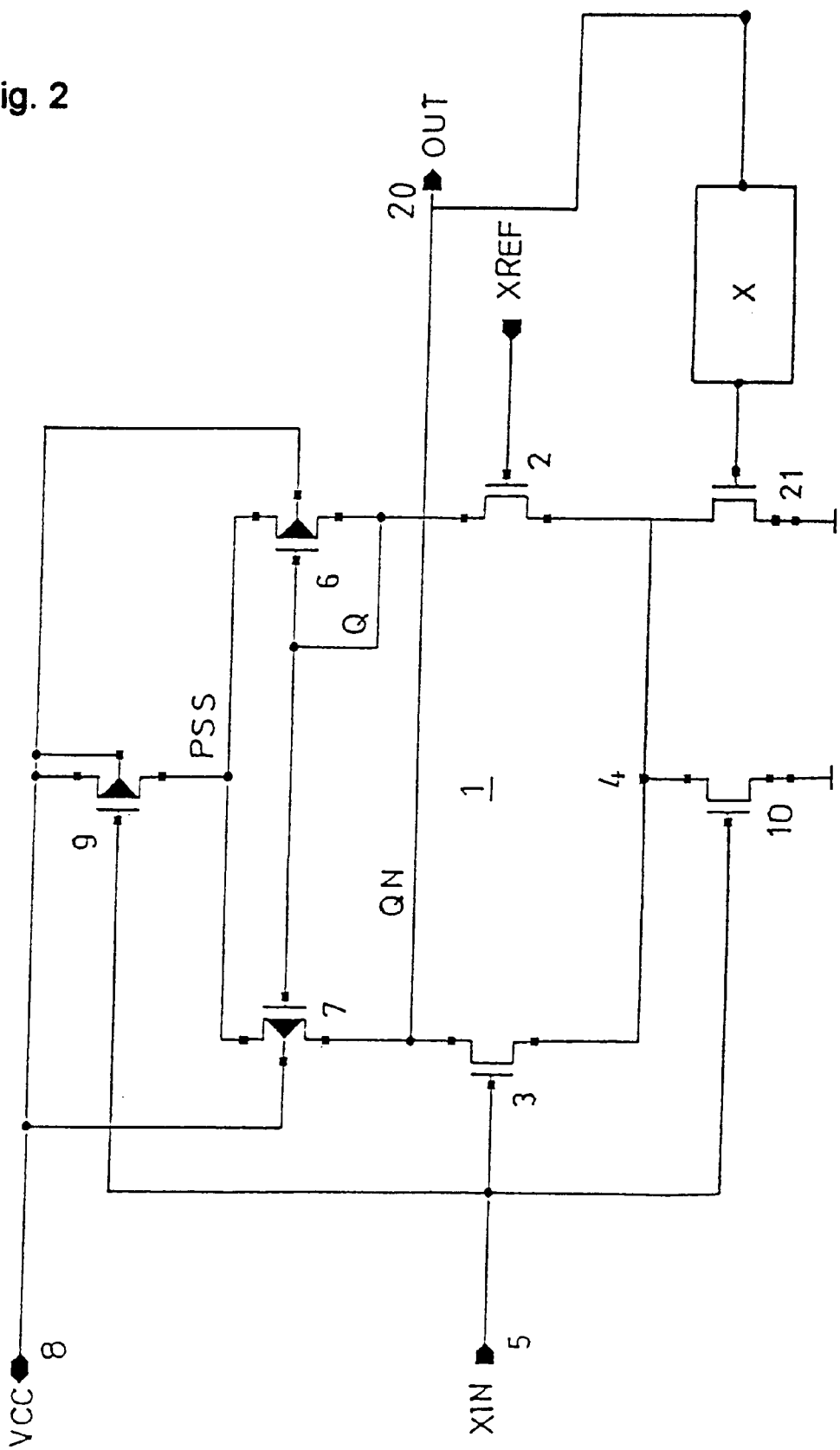
FIG. 2 is a circuit diagram illustrating the input amplifier according to the invention.

The device X comprises an inverted delay element, by way of which the signal, evaluated by the input amplifier, for supplying current to the amplifier is fed back. The device X may, as shown in FIG. 2, be followed by an N-channel MOS transistor 21 acting as a current source. A gate of the transistor 21 receives the delayed output signal and its drain-to-source path is connected between the node 4 and ground.

In the input amplifier of the invention, the transistor 21 is already active via the feedback loop of the input signal XIN. Thus a current is carried through the transistor 21. This in turn means that the voltage at the node Q rises more slowly, and thus the voltage at the node Q can be pulled upward across the transistor 7.

In this way, the input amplifier of the invention makes it possible to switch signals that have very steep edges, so that a shutoff can be performed reliably. The expense for circuitry required in addition to the existing input amplifier is extremely slight, since only the delay element X and the further transistor 21 are additionally needed.

We claim:

1. An input amplifier for input signals with steep edges, comprising:

an input receiving an input signal and an output outputting an output signal;

at least one transistor having an electrode connected to said output; and a device including a delay element and a current source connected between said output and the amplifier for preventing a premature complete shutoff of the input amplifier, said device preventing a current through the input amplifier from being turned off until after the input signal has been evaluated.

2. The input amplifier according to claim 1, wherein said current source of said device is a transistor.

3. An input amplifier for input signals with steep edges, comprising:

a differential amplifier with complementary MOS transistors, said differential amplifier having an input receiving an input signal and an output outputting an output signal;

said differential amplifier being connected to an operating voltage and a reference voltage; and a feedback loop including a delay element and a current source connected between said output and a current source of the amplifier for preventing a premature complete shutoff of the input amplifier connected between said output and said MOS transistors.

4. The input amplifier according to claim 3, wherein said current source of said device is a transistor.

* * * * *